(12) United States Patent
Peterson et al.

(10) Patent No.: US 6,476,470 B1
(45) Date of Patent: Nov. 5, 2002

(54) INTEGRATED CIRCUIT PACKAGING

(75) Inventors: Robert K. Peterson, Garland, TX (US); Burhan Ozmat, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/477,027

(22) Filed: Jun. 7, 1995

Related U.S. Application Data

(63) Continuation of application No. 08/125,048, filed on Sep. 21, 1993.

(51) Int. Cl.$^7$ ............................................. H01L 23/02
(52) U.S. Cl. ........................................ 257/678; 257/686
(58) Field of Search ............................... 257/678, 685, 257/686, 723, 725, 777; 437/205, 215, 915

(56) References Cited

U.S. PATENT DOCUMENTS

| | | | |
|---|---|---|---|
| 4,937,658 A | 6/1990 | Chall, Jr. ..................... | 257/723 |
| 5,041,395 A | * 8/1991 | Steffen ........................ | 257/687 |
| 5,175,613 A | * 12/1992 | Barker, III et al. ......... | 257/659 |
| 5,212,406 A | 5/1993 | Reele et al. ................. | 257/723 |
| 5,280,192 A | 1/1994 | Kryzaniwsky .............. | 257/723 |
| 5,280,193 A | 1/1994 | Lin et al. ..................... | 257/723 |
| 5,296,741 A | 3/1994 | Kim ............................. | 257/723 |

* cited by examiner

*Primary Examiner*—Roy Potter
(74) *Attorney, Agent, or Firm*—Wade James Brady, III; Frederick J. Telecky, Jr.

(57) ABSTRACT

A method of making semiconductor package and the package comprising the steps of providing a base having a plurality of cavities therein, forming a plurality of sets of spaced apart first apertures extending entirely through the base, each of the sets of spaced apart first apertures surrounding one of the cavities, forming a plurality of sets of second apertures extending partially through the base, each of the second apertures of a set being interconnected with a pair of adjacent ones of the first apertures from one of the sets to form a continuous groove extending partially through the base and surrounding one of the cavities and then causing the second apertures to extend entirely through the base to form individual packages associated with each of the cavities. The base is a cast base and the first and second apertures are preferably said base. The second apertures are caused to extend entirely through the base to separate the packages by punching out the remaining portion of the base disposed in the second apertures. Electrical elements are disposed in the cavity and an overlay is provided over the package providing interconnects to the electrical elements in the cavity. The remainder of the cavity is preferably with a potting composition. Optionally, solder balls can be secured to the interconnects and cooling fins can be provided in the base. The base can also be a thin sheet having plurality cavities which can be sawed apart, the thickness of the sheet being at most about the same as the height dimension of the elements disposed within the cavity.

14 Claims, 2 Drawing Sheets

INTEGRATED CIRCUIT PACKAGING

This is a continuation of application Ser. No. 08/125,048 filed on Sep. 21, 1993.

BACKGROUND OF THE INVENTION

1. Field of the Invention

This invention relates to integrated circuit packaging capable of batch manufacture.

2. Brief Description of the Prior Art

Many integrated circuit packaging concepts are presently available for single and multiple semiconductor device applications. Commercial applications are typically potted while military applications use hermetic enclosures.

Devices are mounted on leadframes, interconnected using a wirebond process and subsequently potted with a dielectric material for single devices and commercial applications. A heat exchanger is bonded to the package when improved cooling is required.

When multiple devices are packaged as in integrated function, an internal interconnect is necessary. A package may include a Kovar housing with glass-to-metal feedthroughs for external interface. A multilayer interconnect substrate is adhered to the housing base. Devices are adhered to the substrate and interconnected using the wirebond process. A lid is attached to complete the enclosure. This typical packaging requires interconnect to be effected in a serial manner, one package at a time.

SUMMARY OF THE INVENTION

In accordance with the present invention, there is provided a low cost, batch manufactured package which achieves a size/weight reduction with improved high frequency operation as compared with prior art packages.

Briefly, there is provided a base, preferably cast, of good heat conducting material, preferably a metallized dielectric such as metallized alumina or metal, such as copper, nickel/iron or aluminum. The base is designed and fabricated to provide a plurality of packages thereon.

Each package in the base is defined by a first set of grooves extending entirely through the base material, one such groove on each side of the package. A second set of grooves is disposed at the corners of the package, each of the second set of grooves being connected to a pair of adjacent grooves but not extending entirely through the base material and forming a web. Thereby, each package is connected to each of the packages therearound by the retained portions of each of the second set of grooves. The combination of the two sets of grooves associated with each package provides a groove that completely encircles the package except for the web formed from the material disposed in each of the second set of grooves. The material in the second set of grooves is preferably of minimal dimension such that the material will break down when a minimum of force applied thereto, such as by a punch or the like.

Each package includes a recessed central region or cavity with active and/or passive elements, such as integrated circuits, inductors, capacitors, etc. being disposed within the cavity and secured there with an adhesive or the like. The elements within the cavity can optionally be potted therein with the remainder of the cavity being filled with a filled epoxy or other suitable potting material as is well known, it merely being necessary that bond pads be exposed for later connection when the cavity includes the potting material. An overlay, which is one or more layers of dielectric material, such as, for example, polyimide, includes patterned metallization of copper or aluminum thereon and is disposed on the top surfaces of the package, the metallization including conductors, inductors and the like and pads for connection to the pads on integrated circuits and/or passive devices within the cavity. Where the overlay includes plural layers of insulator and metallization, vias are provided through the insulator for interconnection between layers of metallization as well as to bond pads and the like in the components disposed within the cavity. Optional grooves can be provided on the side of the package opposed to the open end for the purposes of heat dissipation. These grooves can be initially molded into the cast base or can be machined into the base in standard manner.

In accordance with the present invention, the packages can all be fabricated together in their entirety or partially with completion of fabrication taking place after separation of the, packages from each other in the manner discussed hereinabove. The packages are separated by providing a punch or the like which removes the remaining base material in the grooves, this base material being the sole interconnection between packages. This remaining material can be removed from between all of the packages simultaneously by providing a punch with plural punch elements dimensioned to extend through all of the grooves. Alternately, a punch for one or more of the grooves can be provided to remove one or more of the packages from the base material. The result is that the packages will be separated from each other and include corner indentations.

As a further embodiment, the base can be a sheet of metal or the like of the same material as the housing described hereinabove with cavities or indentations therein to receive the active and/or passive elements, the manner of separation of the packages being as described hereinabove or by elimination of the apertures and simple between packages to provide the required separation.

DESCRIPTION OF THE PREFERRED EMBODIMENT

Figure 1:
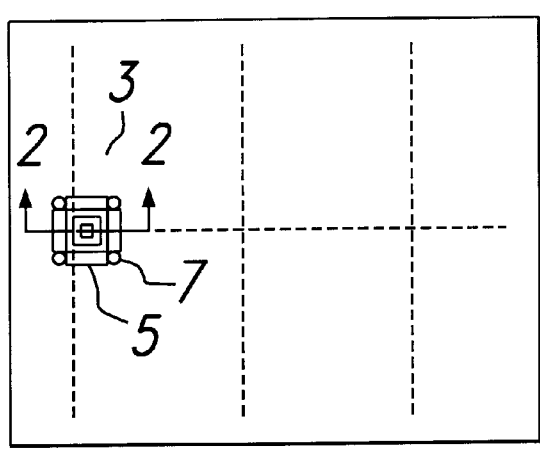
FIG. 1 is a top view of a cast base on which plural packages are fabricated, only one such package being shown.

Referring first to FIG. 1, there is shown a cast base 1 of good heat conducting material, preferably a metallized dielectric such as metallized alumina or metal, such as copper, nickel/iron or aluminum. The base 1 is designed and fabricated to provide a plurality of packages, only one of the packages being shown and described herein. However, it should be understood that plural such packages are being fabricated, generally but not necessarily simultaneously and preferably but not necessarily disposed in a matrix arrangement as implied by the dotted lines.

Figure 2:
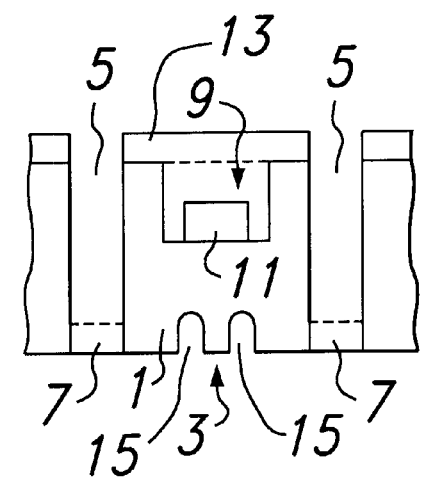
FIG. 2 is a cross section taken along the line 2—2 of FIG. 1.

Referring now to FIGS. 1 and 2, it can be seen that each package 3 in the base 1 is defined by a first set of grooves 5 extending entirely through the base material 1, one such groove on each side of the, package. A second set of grooves 7 is disposed at the corners of the package 3, each of the grooves 7 being connected to a pair of adjacent grooves 5 but not extending entirely through the base material 1. Thereby, each package 5 is connected to each of the packages therearound by the retained portions of grooves 7 as shown in FIG. 2. The combination of the grooves 5 and 7 associated with each package 5 either provides a groove that completely encircles the package 3 or provides such a groove having very thin wall elements between each set of grooves 5 and 7, the walls being of minimal dimension such that the walls will break down when a minimum of force is applied thereto.

Figure 3:
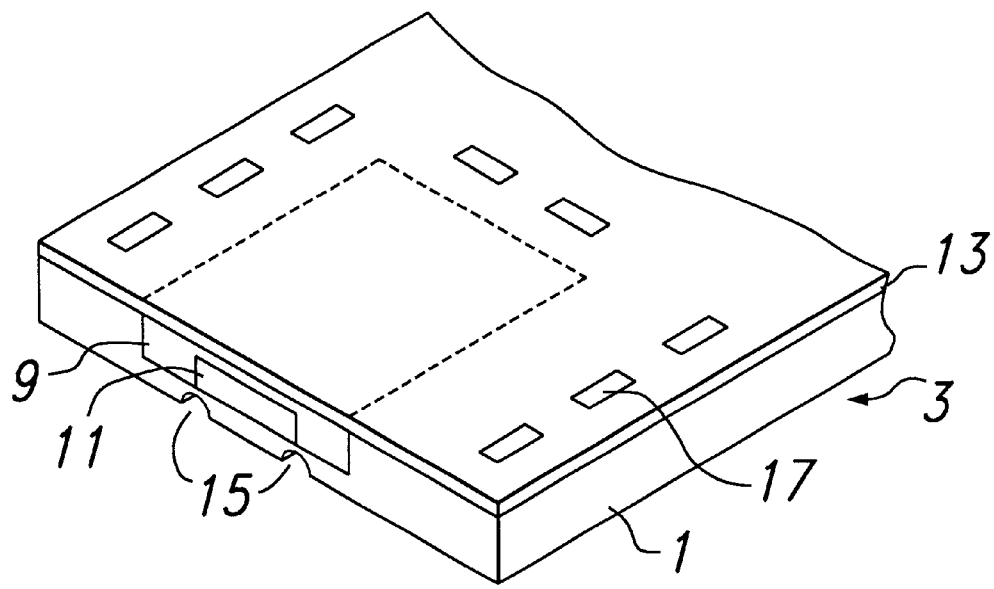
FIG. 3 is a perspective view of a partially fabricated single package in accordance with the present invention.
Figure 4:
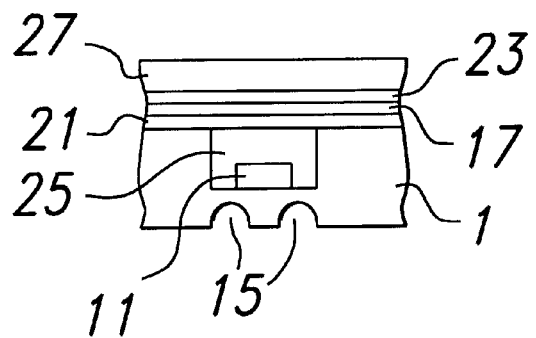
FIG. 4 is a cross sectional view of a second embodiment of a package as in FIG. 2.

As best shown in FIGS. 2 to 4, each package includes a recessed central region or cavity 9 extending to the top of the package with active and/or passive elements 11, such as integrated circuits, inductors, capacitors, etc. being disposed within the cavity and secured there with an adhesive or the like. The devices within the cavity 9 can optionally be potted therein with the unfilled portion of the cavity containing a filled epoxy or other suitable potting composition, it merely being necessary that bond pads be exposed for later connection when the cavity includes the potting material. An overlay 13, which is one or more layers of dielectric material, such as, for example, polyimide, includes patterned metallization 17 of copper or aluminum thereon and is disposed on the top surfaces of the package 3, the metallization including conductors, inductors and the like and pads for connection to the pads on integrated circuits 11 and/or passive devices within the recessed region 9. Where the overlay includes plural layers of insulator and metallization, vias will be provided through the insulator for interconnection between layers of metallization as well as to bond pads and the like in the components disposed within the cavity 9. Optional grooves 15 can be provided on the side of the package opposed to the open end for the purposes of heat dissipation. These grooves can be initially molded into the cast base 1 or can be machined into the base in standard manner.

Figure 5:
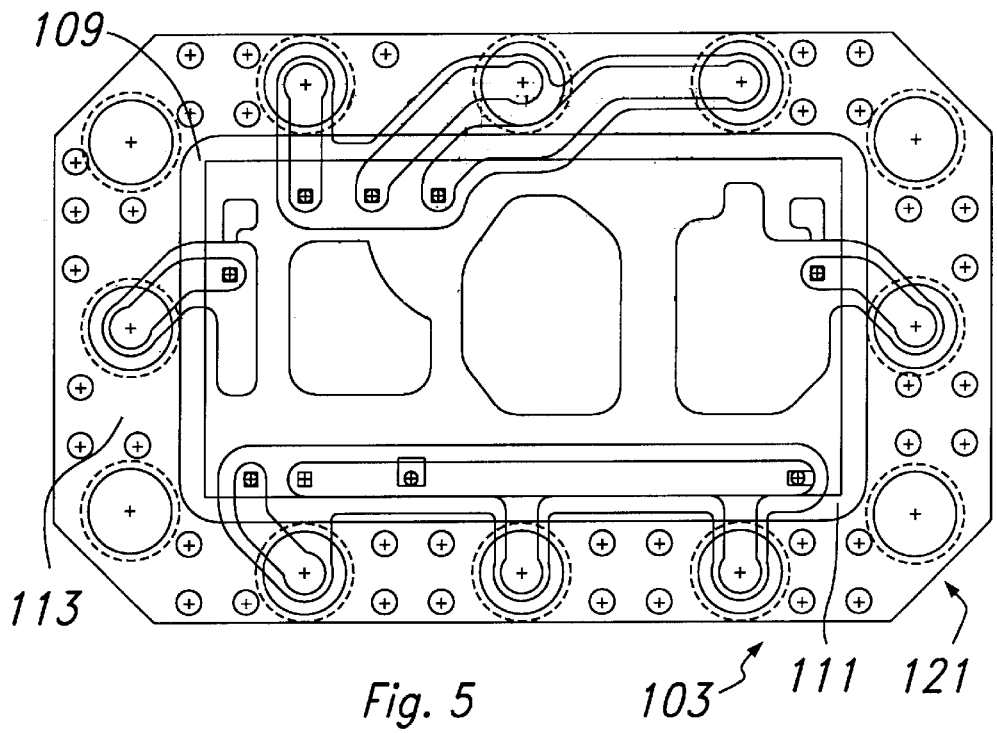
FIG. 5 is a top view of a partially fabricated package in accordance with the present invention showing the overlay.

Referring now to FIG. 5, there is shown a top view of a package 103 in accordance with the present invention with a GaAs amplifier 111 in the cavity 109. The overlay 113 is shown with metallization extending from the top surface of the package to pads on the amplifier 111, the metallization resting on the potting material in the cavity 109 on its path to the pads of the amplifier where potting is used. If potting is not used, the metallization will be partly in the form of an air bridge. The corners 121 of the package 103 are shown indented in view of the removal of the package from the base 1 by means of a punch or the like as described hereinabove.

Figure 6:
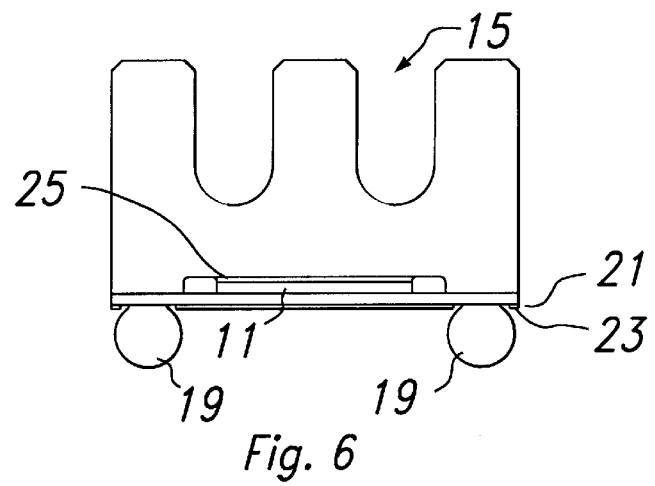
FIG. 6 is a cross sectional view of a third embodiment of a package as in FIG. 2.

Referring to FIG. 6, there is shown a completed package in accordance with the present invention. The package includes, as an option, solder balls 19 secured to metallization 17 for connection to printed circuit boards and the like and to maintain the package raised above the circuit board after connection thereto.

In accordance with the present invention, the packages 3 can be fabricated together in their entirety or partially with completion of fabrication taking place after separation of the packages from each other in the manner discussed hereinabove. The packages are separated by providing a punch or the like which removes the remaining base material in the grooves 7, this base material being the sole interconnection between packages 3 as shown in FIG. 2. This remaining material can be removed from between all of the packages simultaneously by providing a punch with plural punch elements dimensioned to extend through all of the grooves 7. Alternately, a punch for one or more of the grooves can be provided to remove one or more of the packages from the base material 1. The result is that the packages will be separated from each other and include corner indentations such as the indentations 121 of FIG. 5.

Figure 7:
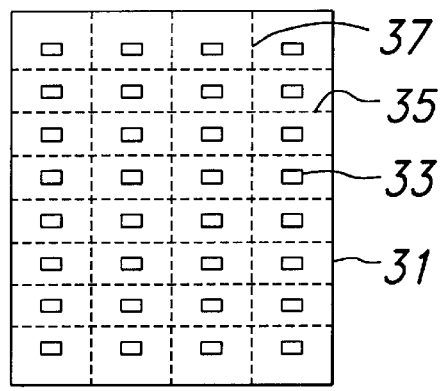
FIG. 7 is a cross sectional view of a fourth embodiment of a package in accordance with the present invention.

Referring now to FIG. 7, there is shown a fourth embodiment in accordance with the present invention. In this embodiment, there is provided base which is a sheet 31 of material, preferably metal and of the type described above with reference to the base. The sheet 31 has a cavity 33 therein and has a thickness preferably but not necessarily slightly greater than that of the components to be placed in the cavity 33. The cavities are preferably arranged in a matrix formation as shown in FIG. 7. After complete or partial fabrication of the total package as described hereinabove with reference to the other embodiments, the packages are separated from each other by any appropriate method, such as, for example, by sawing along the horizontal lines 35 and along the vertical lines 37.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A semiconductor package comprising:
   (a) a base having a plurality of cavities therein;
   (b) a plurality of sets of spaced apart first apertures extending entirely through said base, each of said sets of spaced apart first apertures surrounding a different one of said cavities; and
   (c) a plurality of sets of spaced apart second apertures extending partially through said base, each of said second apertures of each of said sets of spaced apart second apertures being interconnected with a pair of adjacent ones of said first apertures from one of said sets of spaced apart first apertures:
   (d) one set of each of said first set of apertures and one set of each of said second set of apertures toqether forming a continuous groove extending partially through said base and surrounding one of said cavities.

2. The package claim 1 wherein said base is a cast base and said first and second apertures are cast into said base.

3. The package of claim 1, further including electrical elements disposed in each said cavity and an overlay over each said cavity providing interconnects to said electrical elements in each said cavity.

4. The package of claim 2, further including electrical elements disposed in each said cavity and an overlay over each said cavity providing interconnects to said electrical elements in each said cavity.

5. The package of claim 3, at least part of the remainder of each said cavity being filled with a potting composition.

6. The package of claim 4, at least part of the remainder of each said cavity being filled with a potting composition.

7. The package of claim 3 further including solder balls connected to said interconnects.

8. The package of claim 4 further including solder balls connected to said interconnects.

9. The package of claim 1 further including cooling fins in said base.

10. The package of claim 2 further including cooling fins in said base.

11. A semiconductor package comprising:
  (a) a base of a material substantially impervious to electromagnetic radiations and having a plurality of spaced apart cavities therein;
  (b) electrical elements having pads for electrical connection thereto disposed in said cavity; and
  (c) an overlay of dielectric material having an interconnect pattern thereon over each of said cavities, said interconnect pattern providing interconnects to said pads of said electrical elements in said cavity.

12. The package of claim 11 further including a potting composition filling at least a portion of the remainder of each of said cavities, said pads for electrical connection thereto being exposed for connection to said interconnect pattern.

13. The package of claim 11 wherein the depth of said cavities approaches but is less than the thickness dimension of said base.

14. The package of claim 12 wherein the depth of said cavities approaches but is less than the thickness dimension of said base.

* * * * *